United States Patent [19]

Henne et al.

[11] Patent Number: 4,666,952
[45] Date of Patent: May 19, 1987

[54] PHOTOPOLMERIZABLE MIXTURES CONTAINING TERTIARY AMINES AS PHOTOACTIVATORS

[75] Inventors: Andreas Henne, Neustadt; Manfred Jacobi, Frankenthal, both of Fed. Rep. of Germany

[73] Assignee: BASF Aktiengesellschaft, Fed. Rep. of Germany

[21] Appl. No.: 645,297

[22] Filed: Aug. 29, 1984

[30] Foreign Application Priority Data

Aug. 30, 1983 [DE] Fed. Rep. of Germany ....... 3331157

[51] Int. Cl.$^4$ .......................... C08F 2/50; C08F 20/20
[52] U.S. Cl. ...................................... 522/14; 522/10; 522/26
[58] Field of Search ...................... 204/159.18; 522/14

[56] References Cited

U.S. PATENT DOCUMENTS

| | | | |
|---|---|---|---|
| 2,138,762 | 11/1938 | Harmon | 526/312 |
| 3,650,669 | 3/1972 | Osborn et al. | 8/115.53 |
| 3,759,807 | 9/1973 | Osborn et al. | 204/159.23 |
| 4,054,682 | 10/1977 | Kuesters | 204/159.18 |
| 4,071,424 | 1/1978 | Dart et al. | 204/159.15 |
| 4,089,762 | 5/1978 | Frodsham | 204/159.15 |
| 4,233,396 | 11/1980 | Armstrong et al. | 430/320 |

FOREIGN PATENT DOCUMENTS

| | | |
|---|---|---|
| 0003872 | 1/1979 | European Pat. Off. . |
| 0001466 | 6/1981 | European Pat. Off. . |
| 0002625 | 5/1982 | European Pat. Off. . |
| 0012949 | 12/1982 | European Pat. Off. . |

OTHER PUBLICATIONS

Chemical Abstracts 68:48753d "Effect of Structure" Chaltykyan et al, 1968.
Kosar "Light Sensitive Systems", 1965, pp. XIII, 170–171.
"Photopolymerization of Surface Coatings", 1982, Roffey, Wiley & Sons, pp. 70, 71.
Chemical Abstracts, vol. 93, No. 195508x "Photosensitive Laminates", 1980, Toyobo.
Chemical Abstracts, vol. 93, No. 228619q "Photosensitive Resins", 1980, Toyobo.
Chemical Abstracts, vol. 97, No. 101715v "Photosensitive Resin", 1982, Toyobo.

*Primary Examiner*—John C. Bleutge
*Assistant Examiner*—Arthur H. Koeckert
*Attorney, Agent, or Firm*—Keil & Weinkauf

[57] ABSTRACT

Photopolymerizable mixtures comprising one or more photopolymerizable, olefinically unsaturated compounds and one or more photoinitiators or photosensitizers, with or without other conventional additives and/or assistants, contain, as an activator, a tertiary amine of the general formula (I)

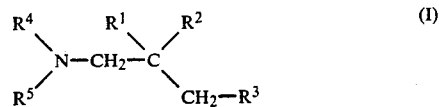

wherein $R^1$ and $R^2$ are each an unsubstituted alkyl, cycloalkyl or phenyl radical, hydroxyl or alkoxy, or $R^1$ and $R^2$ are bonded together to form a cyclic alkylene radical, $R^3$ has the same meanings as $R^1$ or $R^2$ and may furthermore be hydrogen, acyloxy or substituted benzoyloxy, and $R^4$ and $R^5$ are each an unsubstituted or substituted alkyl, cycloalkyl or phenyl radical, or $R^4$ and $R^5$ are bonded together to form a cyclic alkylene or alkyleneoxyalkylene radical.

13 Claims, No Drawings

PHOTOPOLMERIZABLE MIXTURES CONTAINING TERTIARY AMINES AS PHOTOACTIVATORS

The present invention relates to photopolymerizable mixtures which contain one or more photopolymerizable, olefinically unsaturated compounds, one or more photoinitiators or photosensitizers and one or more photoactivators, with or without other additives and/or assistants.

Photopolymerizable mixtures of the type under discussion are known. As a rule, they contain, as photoinitiators or photosensitizers, aryl ketones which are derived from, as parent compounds, benzophenones, acetophenones, benzoins, benzils, benzil monoketals, fluorenone or thioxanthone by suitable substitution. Furthermore, acylphosphine oxide compounds have also been described as photoinitiators. When the photopolymerizable mixtures are exposed to actinic light, the photoinitiators or photosensitizers initiate polymerization of the polymerizable, olefinically unsaturated compounds.

The rate at which the photopolymerizable mixtures undergo photocuring can be accelerated by adding a suitable activator for the photoinitiators or photosensitizers. The activators employed are, in particular, amine compounds (cf. for example U.S. Pat. No. 3,759,807, No. DE-A-26 02 419, No. DE-A-20 03 132, No. DE-A-23 17 945, No. DE-A-22 51 048, No. DE-A-25 22 756, No. EP-A-12 949 and No. EP-A-1466). In particular, hydroxyalkylamines, such as methyldiethanolamine, triethanolamine or derivatives of 2-bis-($\beta$-hydroxyethyl)-aminopropionic acid, the $\omega$-(dialkylamino)alkyl benzoates described in No. EP-A-2625 and the p-dialkylaminobenzoic acid esters described in No. EP-A-3872 are used industrially.

The alkanolamines have the disadvantages that they greatly reduce the shelf life of the photopolymerizable mixtures in which they are employed, and that they are exuded from the cured products, eg. surface-coating films, which consequently appear unattractive. While $\omega$-(dialkylamino)-alkyl benzoates and p-dialkylamino benzoates give photopolymerizable mixtures possessing a satisfactory shelf life, the products produced from photopolymerizable mixtures to which such compounds have been added exhibit undesirable yellowing, which is frequently unacceptable. There is therefore a need for activators which do not possess these disadvantages.

It is an object of the present invention to provide activator-containing photopolymerizable mixtures which have an improved shelf life and high curing rates and, when photocuring is complete, do not exhibit any yellowing, or exudation of any components.

We have found, surprisingly, that this object is achieved if the photopolymerizable mixtures contain, as activators, tertiary amines which carry, on the nitrogen atom, one or more ethyl groups which are trisubstituted in the 2-position as defined below.

The present invention accordingly relates to photopolymerizable mixtures which contain
(a) one or more compounds possessing one or more photopolymerizable, olefinically unsaturated double bonds,
(b) one or more photoinitiators or photosensitizers and
(c) one or more tertiary amines as activators, with or without
(d) other conventional additives and/or assistants, wherein the activators (c) are tertiary amines of the general formula (I)

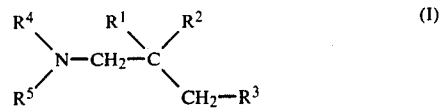

where
$R^1$ and $R^2$ independently of one another are each unsubstituted, hydroxyl-substituted or alkoxy-substituted lower alkyl, unsubstituted, hydroxyl-substituted or alkoxy-substituted cycloalkyl, unsubstituted, alkyl-substituted or alkoxy-substituted phenyl, hydroxyl or lower alkoxy, or $R^1$ and $R^2$ are bonded together to form a cyclic alkylene radical,
$R^3$ has the same meaning as $R^1$ or $R^2$ or is hydrogen or acyloxy, or is benzoyloxy which is substituted by alkyl, alkoxy, halogen and/or dialkylamino, and
$R^4$ and $R^5$ independently of one another are each unsubstituted or hydroxyl-substituted lower alkyl, unsubstituted or hydroxyl-substituted cycloalkyl or unsubstituted, alkyl-substituted or alkoxy-substituted phenyl, or $R^4$ and $R^5$ are bonded together to form a cyclic alkylene radical or a cyclic alkyleneoxyalkylene radical.

The present invention furthermore relates to the use of these photopolymerizable materials, which contain the special amine activators, for the preparation of finishes, coatings, photopolymeric printing or relief plates, resist layers or resist images, UV-curable printing inks, moldings or impregnations.

The tertiary amines which, according to the invention, are present as activators (c) in the photopolymerizable mixtures are in general tertiary ethylamines which are trisubstituted in the 2-position of the ethyl group. The long shelf life of the photopolymerizable mixtures containing the activators according to the invention is surprising in that photopolymerizable mixtures in which the activators present are ethyldialkylamines which are unsubstituted or monosubstituted in the 2-position of the ethyl group have a short shelf life. Compared with some other photocurable materials which contain amine activators, the novel photopolymerizable mixtures also undergo more rapid curing on exposure, and the cured products possess improved stability to yellowing. The novel photopolymerizable materials hence possess a balanced, optimum combination of those properties which are critical and important with respect to such mixtures. mixtures.

Examples of amine activators (c) are the 1-aminopropanes which are disubstituted in the 2-position and at the nitrogen atom. In the general formula (I),
$R^1$ and $R^2$ can be identical or different and are each straight-chain or branched alkyl of, in particular, 1 to 6 carbon atoms, eg. methyl, ethyl, n-propyl, i-propyl, n-butyl, amyl or n-hexyl; alkyl of 1 to 6 carbon atoms which is substituted by hydroxyl or by alkoxy of 1 to 6 carbon atoms, eg. 2-hydroxyethyl, 2-hydroxypropyl, 3-hydroxypropyl, 4-hydroxybutyl, methoxyethyl, ethoxyethyl, methoxypropyl, ethoxypropyl, methoxybutyl or ethoxybutyl; cycloalkyl of, in particular, 5 or 6 carbon atoms, eg. cyclopentyl or cyclohexyl; cycloalkyl, in particular cyclopentyl or cylohexyl, which is substituted by hydroxyl or by alkoxy of, in particular, 1 to 6 carbon atoms; phenyl which is unsubstituted or substituted by alkyl or alkoxy, each of, in particular, 1 to 6 carbon atoms, eg. methylphenyl, ethylphenyl, isopropylphenyl, tert.-butylphenyl, dimethylphenyl, methoxyphenyl, ethoxyphenyl or dimethoxyphenyl; alkoxy of, in particular, 1 to 6 carbon atoms, eg. methoxy, ethoxy, propoxy, butoxy or the $CH_3—(CH_2)_5—O—$ radical, or hydroxyl. $R^1$ and $R^2$ may furthermore be bonded to form a ring, in which case $R^1$ and $R^2$ together form an alkylene radical, in particular $—(CH_2)_n—$ in which n is 4 or 5.

$R^3$ can have the same meaning as $R^1$ or $R^2$ (with the exception of the case where $R^1$ and $R^2$ are bonded together to form a ring), the radicals $R^1$, $R^2$ and $R^3$ being independent of one another and identical or different. $R^3$ can furthermore be hydrogen, acyloxy, in particular the $OR^6$ group, where $R^6$ is straight-chain or branched acyl of, in particular, 1 to 18 carbon atoms, and this acyl radical can possess a double bond in the $\alpha,\beta$-position with respect to the carbonyl group, eg. acryloyl, methacryloyl or stearoyl; benzoyloxy which is substituted in the nucleus by one or more halogen atoms, eg. chlorine, alkyl groups of, in particular, 1 to 6 carbon atoms, eg. methyl, ethyl, isopropyl or tert.-butyl, or alkoxy groups of, in particular, 1 to 6 carbon atoms, eg. methoxy or ethoxy, or by a di-($C_1$-$C_6$-alkyl)-amino group, eg. dimethylamino or diethylamino.

$R^4$ and $R^5$ can be identical or different and are each straight-chain or branched alkyl of, in particular, 1 to 6 carbon atoms, eg. methyl, ethyl, n-propyl, i-propyl, n-butyl, amyl or n-hexyl; hydroxyl-substituted alkyl of, in particular, 1 to 6 carbon atoms, the hydroxyl group preferably being in the $\beta$-position, eg. $\beta$-hydroxyethyl or $\beta$-hydroxypropyl; cycloalkyl of, in particular, 5 or 6 carbon atoms, eg. cyclopentyl or cyclohexyl, which can be unsubstituted or substituted by hydroxyl; or phenyl which is unsubstituted or substituted by alkyl or alkoxy, each of, in particular, 1 to 6 carbon atoms, eg. methylphenyl, ethylphenyl, isopropylphenyl, tert.-butylphenyl, dimethylphenyl, methoxyphenyl, ethoxyphenyl or dimethoxyphenyl. $R^4$ and $R^5$ can furthermore be bonded together to form a ring, in which case $R^4$ and $R^5$ together form, in particular, an alkylene group, such as $—(CH_2)_n—$ in which n is 4 or 5, ie. tetramethylene or pentamethylene, or an alkyleneoxyalkylene radical, in particular the $—(CH_2)_2—O—(CH_2)_2$ radical.

In the general formula (I), $R^1$ and $R^2$ are each preferably alkyl or phenyl, each of which is unsubstituted or substituted by the above radicals, and are each, in particular, alkyl, and very particularly preferably methyl. $R^3$ is preferably hydrogen, hydroxyl, an alkoxy group of the type under discussion, or acyloxy, in particular hydroxyl. $R^4$ and $R^5$ are each preferably alkyl, in particular methyl or ethyl, and $R^4$ and $R^5$ together are preferably tetramethylene or pentamethylene. $R^4$ and $R^5$ are each very particularly preferably alkyl which is substituted in the 2-position by hydroxyl, in particular $\beta$-hydroxyethyl or $\beta$-hydroxypropyl, or methyl.

Examples of preferred activators (c) are 1-dimethylamino-2-phenyl-2-methylpropane, 1-dimethylamino-3-methoxy-2,2-dimethylpropane, 1-dimethylamino-3-acetoxy-2,2-dimethylpropane, 1-diethylamino-3-isopropoxy-2,2-dimethylpropane, 3-N,N-pentamethylene-2,2-dimethylpropan-1-ol, 1-dimethylamino-3-acryloyloxy-2,2-dimethylpropane, 1-dimethylamino-3-methacryloyloxy-2,2-dimethylpropane, 1-dimethylamino-3-benzoyloxy-2,2-dimethylpropane and 1-dimethylamino-3-p-dimethylaminobenzoyl-2,2-dimethylpropane. 3-bis-(2'-hydroxyethyl)-amino-2,2-dimethylpropan-1-ol and 3-bis-(2'-hydroxypropyl)-amino-2,2-dimethylpropan-1-ol are particularly useful, and 3-dimethylamino-2,2-dimethylpropan-1-ol is very particularly suitable.

The tertiary amine compounds which, according to the invention, are present as activators (c) in the photopolymerizable mixtures are known as such, or can be obtained by conventional methods described in the literature. They can be present in the photopolymerizable mixtures either alone or mixed with one another. In general, the photopolymerizable mixtures contain from 0.1 to 20, preferably from 1 to 10, % by weight, based on the photopolymerizable, olefinically unsaturated compounds (a), of the activators (c).

Suitable photoinitiators or photosensitizers (b) which are effective together with the activators (c) used according to the invention in the photopolymerizable mixtures are those which are known per se and which are conventionally employed for photocurable materials. These include, in particular, the compounds, which are effective as photoinitiators or photosensitizers, of the general formula (II)

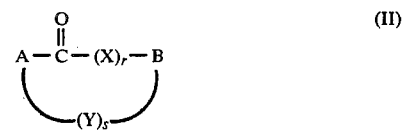

where r and s are each 0 or 1, with the proviso that if s is 0, r is 0 or 1, and if s is 1, r is 0;

A is phenyl which can be unsubstituted or monosubstituted to tetrasubstituted by alkyl, alkoxy or alkylthio, each of 1 to 6 carbon atoms, bis-($C_1$-$C_6$-alkyl)amino or halogen;

X is carbonyl $—C(O)—$ or a $—CR^7R^8$ group, where $R^7$ and $R^8$ can be identical or different and are each hydrogen, hydroxyl, alkyl or alkoxy, each of 1 to 6 carbon atoms, arylalkoxy or $\alpha$-hydroxymethyl, or $R^7$ and $R^8$ together form an alkylene radical $—(CH_2)_n—$, where n is 4 to 6, or an $—O—CH_2—O—CH_2—$ group;

B is phenyl which is unsubstituted or monosubstituted to tetrasubstituted by alkyl, alkoxy or alkylthio, each of 1 to 6 carbon atoms, or by bis-($C_1$-$C_6$-alkyl)amino or halogen; alkyl of 1 to 6 carbon atoms, in which case X, if it is present, should not be carbonyl; hydroxyl, with the proviso that in this case r is 1 and X is $—CR^7R^8$; or a group of the general formula (III)

with the proviso that in this case r is 0, s is 0, Z is oxygen or sulfur, t is 0 or 1 and $R^9$ and $R^{10}$ have the meanings stated below; and where s is 0, Y corresponds to 1 hydrogen atom in each of the groups A and B, and where s is 1, Y is a direct chemical bond or a $—C(O)—$, $—S—$, $—O—$ or $—NH—$ group which bonds the groups A and B, which are ortho to the carbonyl group, with one another.

In the group of the general formula (III), $R^9$ is straight-chain or branched alkyl of, preferably, 1 to 6 carbon atoms, cycloalkyl of, in particular, 5 or 6 carbon atoms, or a phenyl, naphthyl or 5-membered or 6-membered heterocyclic radical which is unsubstituted or substituted by fluorine, chlorine, bromine, alkyl or alkoxy, each of 1 to 4 carbon atoms, a heterocyclic radical preferably containing O, S or N as hetero atoms. $R^{10}$ has the same meanings as $R^9$, and $R^9$ and $R^{10}$ can be identical or different, or $R^{10}$ is alkoxy of 1 to 6 carbon atoms, or phenoxy which is unsubstituted or substituted by alkyl or alkoxy, each of 1 to 6 carbon atoms, or is phenoxyalkyl where alkyl is of 1 to 4 carbon atoms.

One group of suitable photoinitiators or photosensitizers comprises, for example, benzoin and its derivatives, as described in, for example, U.S. Pat. Nos. 2,367,661, 2,722,512 and 2,448,828 and in German Published Applications No. DAS 1,694,149, No. DAS 1,769,853 and No. DAS 1,769,854. These include benzoin itself, benzoin alkyl ethers, in particular those where alkyl is of 1 to 8 carbon atoms, eg. benzoin methyl ether or benzoin isopropyl ether, α-hydroxymethylbenzoin and its alkyl ethers, in particular those where alkyl is of 1 to 8 carbon atoms, eg. α-hydroxymethylbenzoin methyl ether, and α-methylbenzoin and its ethers.

Another group of preferred photoinitiators or photosensitizers comprises benzil and its derivatives, in particular benzil monoketals, as described in, for example, German Published Applications No. DAS 2,232,365, No. DAS 2,261,383, No. DAS 2,337,183 and No. DAS 2,616,382. These include, in particular, benzil dimethyl ketal, benzil methyl ethyl ketal and benzil methyl benzyl ketal.

Other very suitable and advantageous photoinitiators or photosensitizers are the acylphosphine compounds described in, for example, German Laid-Open Applications No. DOS 2,830,927, No. DOS 2,909,994, No. DOS 3,020,092, No. DOS 3,034,697, No. DOS 3,114,341 and No. DOS 3,133,419. Examples of these are 2,4,6-trimethylbenzoyldiphenylphosphine oxide ethyl 2,4,6-trimethylbenzoylphosphinate and 2,4,6-trimethylbenzoylbis-(o-tolyl)phosphine oxide.

Examples of other suitable photoinitiators or photosensitizers are the derivatives of α-hydroxyacetophenone, as described in, for example, No. DE-A-28 08 459, No. DE-A-27 22 264 and No. EP-A-3002. These include 1-phenyl-2-hydroxy-2-methylpropan-1-one, 1-(p-isopropylphenyl)-2-hydroxy-2-methylpropan-1-one and 1-hydroxy-1-benzoylcyclohexane. Further suitable photoinitiators or photosensitizers are benzophenone, fluorenone, anthraquinone, xanthone, thioxanthone and acridone and derivatives of these compounds, as described in, for example, No. DE-A-20 03 122, No. DE-A-21 22 036, No. DE-A-28 11 755, No. EP-A-33721 and U.S. Pat. No. 3,759,807, particularly preferred compounds among these being 2-methylthioxanthone, 2-chlorothioxanthone, 2-isopropylthioxanthone and 2-tert.-butylthioxanthone, as well as mixtures of 2-methyl- and 4-methylthioxanthone and of 2-isopropyl- and 4-isopropylthioxanthone.

The novel photopolymerizable mixtures can contain one or more photoinitiators or photosensitizers (b), the amount of these being in general from 0.01 to 20, preferably from 0.1 to 10, % by weight, based on the photopolymerizable, olefinically unsaturated compounds (a). The ratio of photoinitiators or photosensitizers (b) to activators (c) is in general from 0.1 to 10. The activators (c) are usually employed in amounts which are from 0.5 to 5 times the weight of the photoinitiators or photosensitizers (b).

The novel photopolymerizable mixtures contain, as a further essential component, one or more photopolymerizable, olefinically unsaturated compounds (a). Suitable compounds (a) are in principle all those which possess one or more olefinic C—C multiple bonds and which, in a mixture with the photoinitiator or photosensitizer and the activator, can be stimulated to undergo polymerization. Examples of very suitable compounds are polymerizable compounds which possess C—C double bonds which are activated by, for example, aryl, carbonyl, amide, ester, carboxyl or nitrile groups, halogen atoms, C—C double bonds or C—C triple bonds. The photopolymerizable, olefinically unsaturated compounds (a) can be either low molecular weight or high molecular weight, compounds and are monofunctional, bifunctional or polyfunctionable, ie. they can contain one or more photopolymerizable, olefinic double bonds in the molecule. The said compounds (a) can be present in the novel photopolymerizable mixtures either alone or as a mixture with one another or with other conventional additives, for example saturated and/or unsaturated polymeric binders. Very generally, all monomers, oligomers and/or unsaturated polymers conventionally used for the preparation of photopolymerizable mixtures of the type under discussion can be employed; the type and choice of these compounds depends in particular on the intended use of the photopolymerizable mixture, and is familiar to a skilled worker. Preferably, the photopolymerizable mixture contains, as component (a), compounds possessing two or more olefinic photopolymerizable double bonds, or mixtures of these compounds with compounds possessing only one such double bond. To control the viscosity of the photopolymerizable mixture, it is frequently advantageous to mix a relatively highly viscous, high molecular weight unsaturated and/or saturated compound with one or more low molecular weight, photopolymerizable, olefinically unsaturated compounds.

The low molecular weight, photopolymerizable, olefinically unsaturated compounds (a) include, for example, vinyl compounds, such as vinyl ethers, vinyl esters, styrene, vinyl toluene, vinyl chloride, vinylidene chloride, vinyl ketones, vinyl sulfones, N-vinylpyrrolidone, N-vinyl caprolactam, N-vinyl carbazole and N,N'-divinyl ureas, as well as allyl esters, such as diallyl phthalate.

Particularly advantageous compounds (a) of the stated type are the α,β-olefinically unsaturated mono- and dicarboxylic acids and in particular their derivatives, for example alkyl maleates or fumarates, particularly those where alkyl is of 1 to 8 carbon atoms, and particularly preferably acrylic acid and/or methacrylic acid and their derivatives, eg. acrylonitrile, methacrylonitrile, acrylamide, methacrylamide, N-methylolacrylamide and N-methylolmethacrylamide, and the esters of acrylic acid and/or methacrylic acid with monohydric or polyhydric alcohols. These include, for example, the diacrylates, polyacrylates, dimethacrylates and polymethacrylates of alkylene glycols, polyalkylene glycols and polyhydric alkanols of 2 to 20 carbon atoms, such as the diacrylates, polyacrylates, dimethacrylates and polymethacrylates of ethylene glycol, diethylene glycol, triethylene glycol, polyethylene glycols having a molecular weight of about 500, propane-1,2-diol, propane-1,3-diol, polypropylene glycols having a molecular weight of about 500, neopentylglycol (2,2-dimethylpropanediol), butane-1,4-diol, 1,1,1-trimethylolpropane, glycerol and pentaerythritol; and the monoacrylates and monomethacrylates of such diols and polyols, eg. ethyleneglycol, diethyleneglycol, triethyleneglycol or tetraethyleneglycol monoacrylate or monomethacrylate, butane-1,4-diol monoacrylate or monomethacrylate or hexanediol monoacrylate or monomethacrylate, the acrylates and methacrylates of monoalkanols of 1 to 20 carbon atoms, such as methyl acrylate or methacrylate, ethyl acrylate or methacrylate, propyl acrylate or methacrylate, butyl acrylate or methacrylate, hexyl acrylate or methacrylate or 2-ethylhexyl acrylate or methacrylate; and monomers or oligomers which possess two or more acrylic double bonds and contain urethane and/or amide groups.

Preferred photopolymerizable, olefinically unsaturated, relatively high molecular weight compounds are epoxide acrylates, preferably those having a molecular weight of from 200 to 1,500, as obtained by, for example, reacting acrylic acid and/or methacrylic acid with aromatic and/or aliphatic diglycidyl ethers, for example those based on bisphenol A, butanediol, pentaerythritol or neopentylglycol, or with epoxidized polybutadienes or linseed oils; polyester-acrylates, as can be prepared by, for example, reacting a hydroxyl-containing polyester with acrylic acid and/or methacrylic acid; and urethane-acrylates, in particular those having a molecular weight of from 200 to 4,000, as can be prepared by, for example, reacting a hydroxyalkyl acrylate or methacrylate (such as hydroxyethyl acrylate or methacrylate, hydroxypropyl acrylate or methacrylate or butanediol monoacrylate or monomethacrylate) with, preferably, an aliphatic or cycloaliphatic diisocyanate (eg. hexamethylene diisocyanate or isophorone diisocyanate) and, if necessary, a polyol (eg. low molecular weight alkanediols, polyalkylene glycols, hydroxyl-containing polyesters or hydroxyl-containing polyacrylates) as a chain extender.

Other suitable photopolymerizable, olefinically unsaturated compounds (a) are polymeric compounds, for example unsaturated polyesters, prepared from $\alpha,\beta$-unsaturated dicarboxylic acids, such as maleic acid, fumaric acid or itaconic acid, if appropriate as a mixture with saturated aliphatic or aromatic dicarboxylic acids, such as adipic acid, phthalic acid, terephthalic acid or tetrahydrophthalic acid, by reaction with an alkanediol, such as ethylene glycol, propylene glycol, butanediol, neopentyl glycol or oxyalkylated bisphenol A; unsaturated amino resins, as obtained by, for example, reacting aminoplasts or etherified aminoplasts, such as melamine/formaldehyde or urea/formaldehyde condensates, with hydroxyalkyl acrylates; butadiene and/or isoprene polymers, vinyl-containing polyurethanes, diallyl phthalate prepolymers and modified polyvinyl alcohols possessing photopolymerizable, olefinically unsaturated side groups, for example vinyl-containing polyvinyl alcohols and acrylyl-containing and/or methacrylyl-containing polyvinyl alcohols.

As stated above, other saturated and/or unsaturated compounds, in particular polymers, can be added to the photopolymerizable, olefinically unsaturated compounds (a). Examples of polymeric binders which can be present in the novel mixtures together with the said compounds (a) are saturated or unsaturated polyesters, polyacrylates and polymethacrylates, polyurethanes, such as polyether-urethanes and polyester-urethanes, linear nylons and, in particular, alcohol-soluble nylon copolymers, cellulose derivatives, polyvinyl alcohols, and polymers and copolymers of vinyl esters of aliphatic monocarboxylic acids of 1 to 4 carbon atoms, in particular to vinyl acetate and vinyl propionate, having various degrees of hydrolysis, homopolymers and copolymers of conjugated aliphatic dienes, in particular butadiene and/or isoprene polymers which can contain, as comonomers, in particular styrene, acrylonitrile, acrylates or methacrylates; copolymers of styrene with maleic anhydride, with maleates or with maleic acid half-esters, styrene/maleic anhydride/acrylic or methacrylic acid copolymers, polyethers, polyureas, polyimides and the like. In those photopolymerizable mixtures which are to be used for the production of optical information recording systems, in particular of photopolymer printing plates or resist images, if not in all of the mixtures, the saturated and/or unsaturated compounds, in particular the polymeric binders, which are present in the photopolymerizable mixtures should be compatible with the photopolymerizable compounds (a), which are also present in the said mixtures.

The novel photopolymerizable mixtures can furthermore contain other additives and/or assistants, such as thermal polymerization inhibitors, skin-forming substances, eg. paraffins, inorganic and/or organic pigments, dyes, inorganic and/or organic fillers, leveling agents, eg. silicone oils, dulling agents, lubricants, eg. waxes, stabilizers against thermal or photochemical decomposition, reinforcing agents or organic solvents, eg. alcohols, hydrocarbons or ketones.

The type and amount of the further additives and/or assistants (d) depend on the particular intended use of the photopolymerizable mixtures, and are sufficiently familiar to a skilled worker.

The novel photopolymerizable mixtures are suitable, for example, for the production of photocurable finishes and of coatings, in particular from 2 to 400 $\mu$m thick, on any substrates, such as metals, wood, plastics, glass, paper or cardboard. The coatings can serve as protective layers or for decorative purposes. Photopolymerizable mixtures which are very useful for this purpose contain, for example, from 0 to 100, preferably from 30 to 60, % by weight, based on the photopolymerizable compounds (a) employed, of a high molecular weight photopolymerizable, olefinically unsaturated compound, from 0 to 100, preferably from 40 to 70, % by weight, based on the said compounds (a), of a low molecular weight photopolymerizable, olefinically unsaturated compound, from 0.1 to 10, preferably from 1 to 5, % by weight, based on the photopolymerizable mixture, of one or more photoinitiators, and from 1 to 20, preferably from 2 to 10, % by weight, based on the photopolymerizable mixture, of 1 or more activators, with or without the usual amounts of other conventional additives and/or assistants.

Furthermore, the novel photopolymerizable mixtures can very advantageously be used for the production of systems for optical information recording, in particular for the preparation of photopolymerizable recording materials for the production of photopolymeric printing or relief plates, eg. letterpress, gravure, offset or screen printing plates, and of resist layers or resist images, as used for etching or electroplating or for the production of printed circuit boards and printed circuits in thick-layer and thin-layer technology. The relief-forming or resist-forming photosensitive layer of such photopolymerizable recording materials, which is applied onto a dimensionally stable base, advantageously consists of a photopolymerizable mixture of from 1 to 60, preferably from 5 to 40, % by weight of low molecular weight photopolymerizable, olefinically unsaturated compounds (a), from 0.1 to 10, preferably from 0.5 to 5, % by weight of one or more photoinitiators (b), from 0.01 to 10, preferably from 0.5 to 5, % by weight of one or more activators (c) and from 35 to 98.9, preferably from 55 to 93, % by weight of a polymeric binder which is compatible with said compounds (a), with or without the usual amounts of other conventional additives and/or assistants.

Finally, the novel photopolymerizable mixtures are also suitable for the production of UV-curable printing inks and printing pastes for printing sheet metal, paper or plastics in thicknesses of from 0.5 to 10 μm, and for the production of moldings and impregnations; in the case of the two last-mentioned applications, the photopolymerizable mixtures can in principle have the same composition as stated above for the production of the coatings.

Any radiation source which emits actinic light in the wavelength range from 230 to 450 nm, preferably from 300 to 420 nm, or which emits a sufficiently high proportion of light within this wavelength range, can be used as a radiation source for the curing and photopolymerization of the novel mixtures. Particularly useful radiation sources are those whose emission maxima are matched to the absorption range of the photoinitiators or photosensitizers (b) and activators (c) present in the photopolymerizable mixtures. Preferred radiation sources are mercury vapor lamps, superactinic fluorescent tubes and pulsed lamps. If necessary, doped lamps can be used.

The Examples and comparative experiments which follow illustrate the invention and the advantages obtained using the novel photopolymerizable mixtures. In the Examples and comparative experiments, parts and percentages are by weight, unless stated otherwise.

EXAMPLE 1 AND COMPARATIVE EXPERIMENTS A1 TO A9

Photopolymerizable mixtures were prepared from the following components:
59 parts of a reaction product obtained from bisphenol A diglycidyl ether with 2 equivalents of acrylic acid,
41 parts of hexane-1,6-diol diacrylate,
1 part of benzil dimethyl ketal and
2 parts of benzophenone,
and, in each case, one of the amine activators stated below, in the amount stated in Table 1.

Example 1 (according to the invention): 3-dimethylamino-2,2-dimethylpropan-1-ol
Comparison A1: methyldiethanolamine
Comparison A2: ethyldiethanolamine
Comparison A3: isopropyldiethanolamine
Comparison A4: isobutyldiethanolamine
Comparison A5: butyldiethanolamine
Comparison A6: cyclohexyldiethanolamine
Comparison A7: 3-dimethylaminopropanol
Comparison A8: ethyl p-dimethylaminobenzoate (EP-A-3872)
Comparison A9: 2-dimethylaminoethyl benzoate (EP-A-2625).

The amounts of amine activators added were chosen so that, in each case, they were present in the photopolymerizable mixture in the same molar concentration, ie. 0.025 mole of amine activator per kg of the total mixture.

TABLE 1

| Examples or comparative experiment | Amount of amine (parts) | Maximum transport belt speed in m/min | | | Viscosity (efflux times in sec according to DIN 53,211) | | |
|---|---|---|---|---|---|---|---|
| | | (a) 1-2 h after addition of amine | (b) after addition of amine & storage for 14 days at 60° C. | (c) % change from (a) to (b) | (a) 1-2 h after additon of amine | (b) after addition of amine & storage for 7 days at 60° C. | (c) % change from (a) to (b) |
| 1 (invention) | 3.3 | 40 | 40 | 0 | 79 | 88 | +11.4 |
| A1 | 3 | 60 | 25 | −58.3 | 88 | 160 | +81.8 |
| A2 | 3.5 | 65 | 30 | −53.8 | 86 | 99 | +15.1 |
| A3 | 3.7 | 55 | 25 | −36.4 | 85 | 85 | 0 |
| A4 | 4.0 | 45 | 30 | −33.3 | 86 | 85 | 0 |
| A5 | 4.0 | 55 | 25 | −54.5 | 85 | 90 | +5.9 |
| A6 | 4.7 | 40 | 20 | −50.0 | 96 | 96 | 0 |
| A7 | 2.6 | 30 | 25 | −16.7 | 92 | 226 | +145.7 |
| A8 | 4.9 | 30 | 30 | 0 | 85 | 84 | 0 |
| A9 | 4.9 | 35 | 35 | 0 | 88 | 163 | +85.2 |

To measure the reactivity of the homogeneous photopolymerizable mixtures, a 15 μm thick layer of the mixture was applied onto a glass plate and cured by means of a high-pressure mercury lamp (output: 100 W/cm of arc length, distance 10 cm). The exposure time required to produce a very hard, scratch-resistant surface was determined for each sample. This minimum exposure time is expressed in Table 1 as the maximum transport belt speed with which the samples could be moved past below the lamp to achieve a scratch-resistant surface. A second batch of samples was subjected to the hardening test after storage for 14 days at 60° C. The decrease in the maximum possible transport speed at which an equally scratch-resistant surface is achieved is a measure of the decrease in the reactivity of the photopolymerizable mixtures during storage. Furthermore, the viscosity of the photopolymerizable mixtures before and after storage for 7 days at 60° C. was determined (efflux times according to No. DIN 53,211). Any increase in viscosity serves as a measure of undesirable changes in the ready-formulated photopolymerizable mixture during storage. The results are summarized in Table 1.

The data in Table 1 show that, in Comparative Experiments A1 to A6, higher or equally high curing rates could be achieved immediately after the addition of the activator, but these curing rates decreased greatly on storage. In contrast, the addition of the novel activator did not lead to any reduction in the curing rate as a result of storage, so that, after the photopolymerizable mixtures had been stored for 14 days, the curing rates obtained were substantially higher than in the case of Comparative Experiments A1 to A6. Compared with Comparative Experiments A7 to A9, the novel mixtures exhibit a higher curing rate both before and after storage.

EXAMPLE 2 AND COMPARATIVE EXPERIMENTS B1 to B9

Various photopolymerizable mixtures were prepared as described in Example 1 and Comparative Experiments A1 to A9. To test the exudation of components from the mixtures, and the weather resistance of the cured coatings prepared with these mixtures, the said mixtures were applied in a 100 μm thick layer onto art paper by means of a knife coater. To test for yellowing of the cured coatings produced with these mixtures, the latter were applied with a knife coater onto white photographic paper to give a layer having the same thickness. The curable coatings produced in this manner were cured using the same lamp as in Example 1, at a transport belt speed of 10 m/min. Exudation of the activators from the cured layers was assessed visually in accordance with DIN 53,230, after storage at 23° C. for 3 days and 21 days. The weather resistance of the cured layers was evaluated after accelerated weathering for 1,000 hours in an Atlas W60 Weatherometer, the evaluation being based on a scale from 0 to 5. The degree of whiteness according to Berger was determined as a measure of the yellowing of the resulting cured coatings. The measured values obtained are summarized in Table 2.

Table 2 shows that the activator according to the invention is exuded from the cured layers to a much smaller extent than the amines of Comparative Experiments B1 to B5 and B7. Although the amines of Comparative Experiments B8 and B9 are not exuded, the cured coatings produced with these amines are less weather resistant and exhibit much more pronounced yellowing. Tables 1 and 2 both show clearly that the combination of properties of the mixtures according to the invention is superior to that of the comparative products.

EXAMPLE 3 AND COMPARATIVE EXPERIMENT C

Example 1 and Comparative Experiment A1 were repeated, except that in this case, instead of benzil dimethyl ketal and benzophenone, 1.5 parts of 2-methylthioxanthone were used as the photoinitiator. The curing rates and the changes in the reactivity of the photopolymerizable mixtures during storage are shown in Table 3.

TABLE 2

| Example or comparative experiment | Exudation after storage at 23° C. After 3 days | Exudation after storage at 23° C. After 21 days | Weather resistance | Yellowing (degree of whiteness according to Berger) |
|---|---|---|---|---|
| Example 2 | 0 | 1–2 | 1 | 83 |
| Comparison B1 | 3–4 | 4 | 1–2 | 83 |
| B2 | 3–4 | 4 | 2 | 84 |
| B3 | 3–4 | 4 | 1–2 | 84 |
| B4 | 2 | 4 | 3 | 82 |
| B5 | 0 | 4 | 2–3 | 83 |
| B6 | 0 | 0 | 2 | 80 |
| B7 | 4 | 4 | 4 | 80 |
| B8 | 0 | 0 | 5 | 50 |
| B9 | 0 | 0 | 1–2 | 69 |

EXAMPLE 4 AND COMPARATIVE EXPERIMENT D

Example 1 and Comparative Experiment A1 were repeated, except that in this case the addition of benzophenone was dispensed with and instead the amount of benzil dimethyl ketal was increased to 2 parts. The curing rates determined for these polymerizable mixtures, and their changes in ceactivity during storage, are likewise shown in Table 3.

EXAMPLE 5 AND COMPARATIVE EXPERIMENT E

Example 1 and Comparative Experiment A1 were repeated, except that in this case, instead of benzil dimethyl ketal and benzophenone, 2 parts of 1-phenyl-2-hydroxy-2-methylpropanone were added as the initiator. The results obtained are reproduced in Table 3.

TABLE 3

| Example or comparative experiment | Maximum transport speeds in m/min (a) 1–2 h after the addition of amine | (b) after the addition of amine and storage for 7 days at 60° C. | (c) Percentage change from (a) to (b) |
|---|---|---|---|
| C | 70 | 25 | −64.3 |
| 3 | 45 | 45 | 0 |
| D | 20 | 15 | −25.0 |
| 4 | 15 | 15 | 0 |
| E | 30 | 20 | −33.3 |
| 5 | 20 | 25 | +20.0 |

We claim:

1. A photopolymerizable mixture, containing
   (a) one or more compounds possessing one or more photopolymerizable, olefinically unsaturated double bonds,
   (b) one or more photoinitiators or photosensitizers selected from aryl ketones and acyl phosphine oxides and
   (c) as activators, one or more tertiary amines of the formula

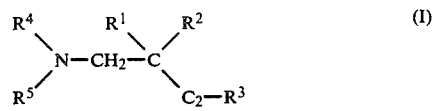

where
R$^1$ and R$^2$ are each methyl, R$^3$ is hydroxyl, and R$^4$ and R$^5$ independently of one another are each unsubstituted or hydroxyl-substituted lower alkyl.

2. A photopolymerizable mixture as set forth in claim 1, wherein the activator (c) is a compound of the formula (I), where R$^1$ and R$^2$ are each CH$_3$, R$^3$ is OH and R$^4$ and R$^5$ are each 2-hydroxyethyl or 2-hydroxypropyl.

3. A photopolymerizable mixture as set forth in claim 1, wherein the activator (c) is 1-hydroxy-2,2-dimethyl-3-dimethylaminopropane.

4. A photopolymerizable mixture as set forth in claim 1, wherein the activator or activators (c) are present in an amount of from 0.1 to 20% by weight, based on the photopolymerizable, olefinically unsaturated compounds (a).

5. A photopolymerizable mixture as set forth in claim 1, wherein the photoinitiator or photosensitizer, or the photoinitiators or photosensitizers, are present in an amount of from 0.01 to 20% by weight, based on the photopolymerizable, olefinically unsaturated compounds (a).

6. A photopolymerizable mixture as set forth in claim 1, wherein the weight ratio of the photoinitiator or photosensitizer (b) to the activator (c) in the photopolymerizable mixture is from 1:10 to 10:1.

7. A photopolymerizable mixture as claimed in claim 1, which contains, as the photoinitiator or photosensitizer (b), one or more active compounds from the group consisting of benzoin, benzoin derivatives, benzil and benzil derivatives.

8. A photopolymerizable mixture as set forth in claim 1, which contains, as the photoinitiator or photosensitizer (b), one or more active compounds from the group consisting of acetophenone, benzophenone, fluorenone, anthraquinone, xanthone, thioxanthone, acridone and the derivatives of these compounds.

9. A photopolymerizable mixture as set forth in claim 1, which contains, as the photoinitiator or photosensitizer (b), one or more acylphosphine compounds.

10. A photopolymerizable mixture as claimed in claim 1, which contains, as photopolymerizable, olefinically unsaturated compounds (a), low molecular weight vinyl compounds.

11. A photopolymerizable mixture as set forth in claim 1, which contains, as photopolymerizable, olefinically unsaturated compounds (a), low molecular weight or high molecular weight compounds of $\alpha,\beta$-olefinically unsaturated carboxylic acids.

12. A photopolymerizable mixture as set forth in claim 11, which contains, as the compounds (a), polyester(meth)acrylates, epoxide(meth)acrylates and/or urethane(meth)acrylates.

13. A photopolymerizable mixture as set forth in claim 1, which contains saturated and/or unsaturated polymeric binders in addition to the photopolymerizable, olefinically unsaturated compounds (a).

* * * * *